United States Patent
Kuan

(10) Patent No.: US 7,545,645 B2
(45) Date of Patent: Jun. 9, 2009

(54) HEAT DISSIPATION DEVICE

(75) Inventor: Zhi-Bin Kuan, Tu-Cheng (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/862,476

(22) Filed: Sep. 27, 2007

(65) Prior Publication Data
US 2009/0021913 A1 Jan. 22, 2009

(30) Foreign Application Priority Data
Jul. 20, 2007 (CN) .................... 2007 1 0076088

(51) Int. Cl.
*H05K 7/20* (2006.01)
(52) U.S. Cl. ............... 361/700; 361/695; 165/80.3; 165/104.33; 165/185
(58) Field of Classification Search ........... 361/700, 361/704, 697, 703, 719, 689, 690; 257/722; 165/185, 80.3, 121, 122; 174/16.3
See application file for complete search history.

(56) References Cited

U.S. PATENT DOCUMENTS

| | | | | |
|---|---|---|---|---|
| 4,765,397 A | * | 8/1988 | Chrysler et al. | 165/104.33 |
| 6,487,076 B1 | * | 11/2002 | Wang | 361/697 |
| 6,882,532 B2 | * | 4/2005 | Chen et al. | 361/690 |
| 6,903,930 B2 | * | 6/2005 | DiStefano et al. | 361/700 |
| 6,935,419 B2 | * | 8/2005 | Malone et al. | 165/185 |
| 6,938,682 B2 | * | 9/2005 | Chen et al. | 165/104.33 |
| 7,028,753 B2 | * | 4/2006 | Sterner | 165/80.3 |
| 7,128,140 B2 | | 10/2006 | Barmoav et al. | |
| 7,343,962 B2 | * | 3/2008 | Xia et al. | 165/80.3 |
| 2002/0174980 A1 | * | 11/2002 | DiBene et al. | 165/185 |
| 2008/0043436 A1 | * | 2/2008 | Hung et al. | 361/700 |

FOREIGN PATENT DOCUMENTS

CN 2715345 Y 8/2005

* cited by examiner

*Primary Examiner*—Boris L Chervinsky
*Assistant Examiner*—Courtney L Smith
(74) *Attorney, Agent, or Firm*—Frank R. Niranjan

(57) ABSTRACT

A heat dissipation device includes a heat spreader (20), a heat pipe (30), a heat sink (40) and a cooling fan (50) for generating forced airflow to the heat sink. The heat pipe has an evaporating section (301) being thermally attached to the heat spreader and a condensing section (302). The heat sink has a fin assembly defining a plurality of channels (405) for the airflow flowing therethrough. Each of the channels has at least one portion with a width being gradually decreased along the flowing direction of the airflow. The channels (405) each are defined between two adjacent fins (401, 402), wherein at least one of the two adjacent fins is arc-shaped.

19 Claims, 7 Drawing Sheets

HEAT DISSIPATION DEVICE

BACKGROUND OF THE INVENTION

1. Field of the Invention

The present invention relates generally to a heat dissipation device, and particularly to a heat dissipation device for a heat generating electronic device.

2. Description of Related Art

With the continuing development of the electronic technology, electronic packages such as CPUs (central processing units) are generating more and more heat that requires immediate dissipation. Cooling fans are commonly used in combination with heat sinks for cooling CPUs.

Oftentimes, the heat sink includes a plurality of fins stacked together. Each fin is planar and parallel to each other. A flow channel is formed between two adjacent fins. The cooling fan is arranged at a side of the heat sink, facing the flow channels thereof. During operation, the heat sink absorbs the heat generated by the CPU. The airflow generated by the cooling fan flows through the flow channels to exchange heat with the fins. Then the heat is dissipated to surrounding environment by the airflow. Thus, heat dissipation of the heat generating device is accomplished.

For the planar shape of the fins, each of the flow channels has a constant size along the flowing direction of the airflow. Due to viscosity, a laminar air envelope may be formed at a surface of each of the fins of the heat sink when the airflow flows through the heat sink. The flowing speed of the airflow in this laminar air envelope is nearly zero, whereby the degree of heat exchange between the airflow and the heat sink is greatly reduced. Therefore, the airflow flowing through the heat sink cannot sufficiently assist the heat dissipation from the fins to the surrounding environment, wherein the fins absorb the heat from the heat-generating electronic package. Accordingly, heat dissipation effectiveness of the conventional heat sink is limited.

For the foregoing reasons, therefore, there is a need in the art for a heat dissipation device which overcomes the above-mentioned problems.

SUMMARY OF THE INVENTION

According to a preferred embodiment of the present invention, a heat dissipation device includes a heat spreader, a heat pipe, a heat sink and a cooling fan for generating forced airflow to the heat sink. The heat pipe has an evaporating section being thermally attached to the heat spreader and a condensing section. The heat sink has a fin assembly defining a plurality of channels for the airflow flowing therethrough. Each of the channels has at least one portion with a width being gradually decreased along the flowing direction of the airflow. The fan is located between the heat spreader and an air inlet of heat sink, wherein the channels at the air inlet each have a maximum width.

Other advantages and novel features of the present invention will be drawn from the following detailed description of the preferred embodiments of the present invention with attached drawings, in which:

BRIEF DESCRIPTION OF THE DRAWINGS

Many aspects of the present heat dissipation device can be better understood with reference to the following drawings. The components in the drawings are not necessarily drawn to scale, the emphasis instead being placed upon clearly illustrating the principles of the present heat dissipation device. Moreover, in the drawings, like reference numerals designate corresponding parts throughout the several views.

DETAILED DESCRIPTION OF THE INVENTION

Figure 1:
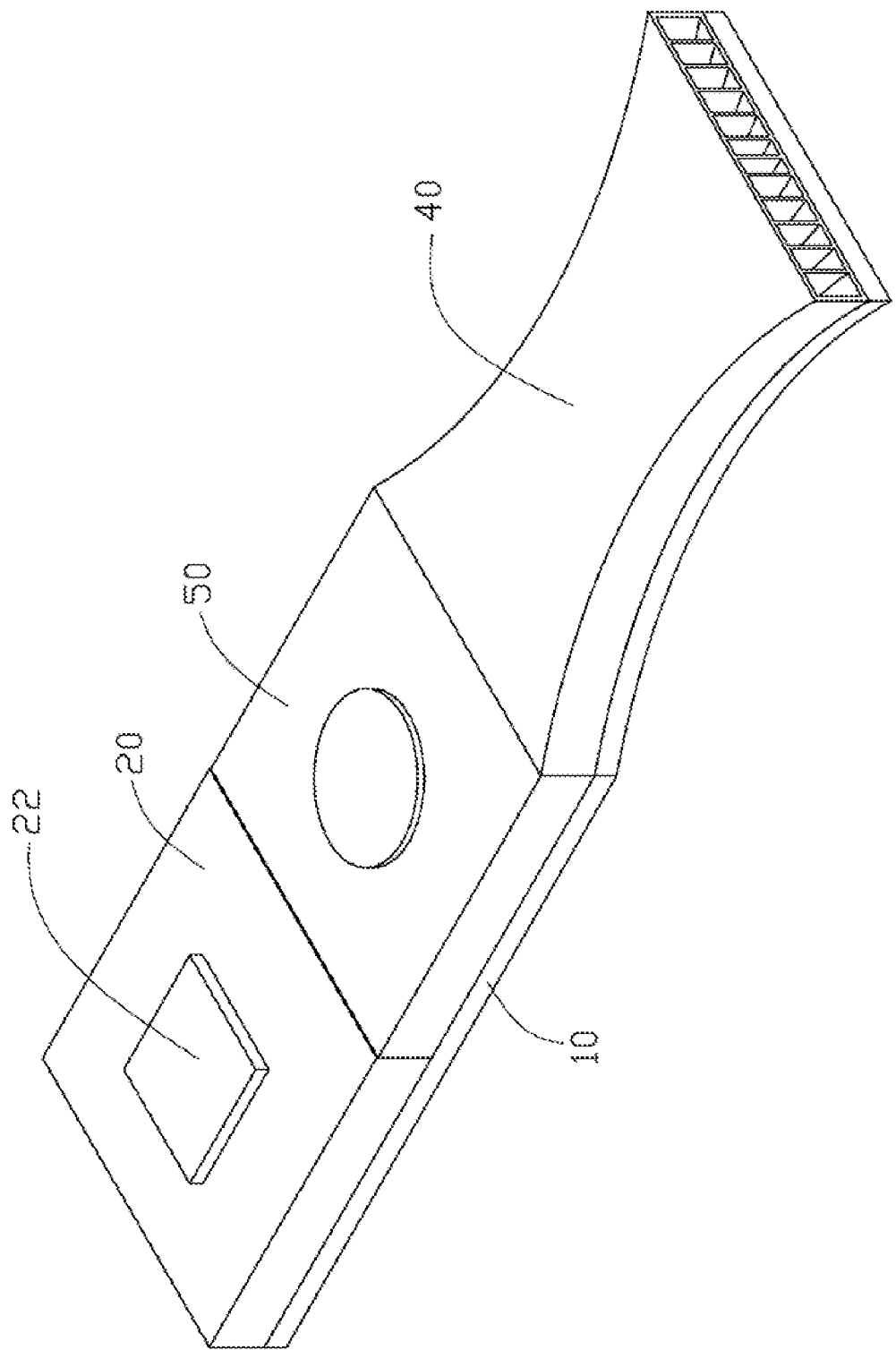
FIG. 1 is an isometric, assembled view of a heat dissipation device in accordance with a preferred embodiment of the present invention.
Figure 2:
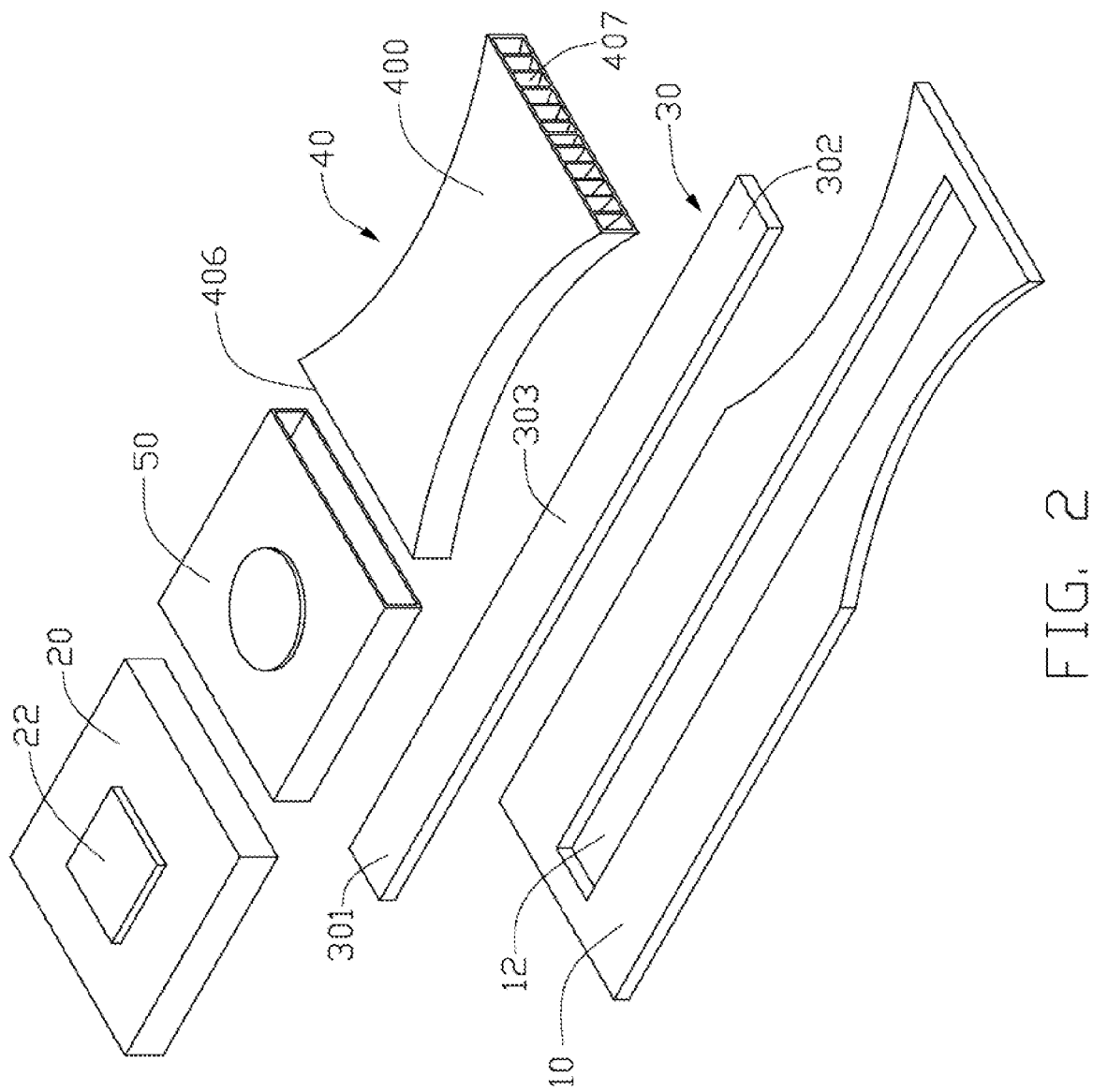
FIG. 2 is an isometric, explored view of the heat dissipation device of FIG. 1.
Figure 3:
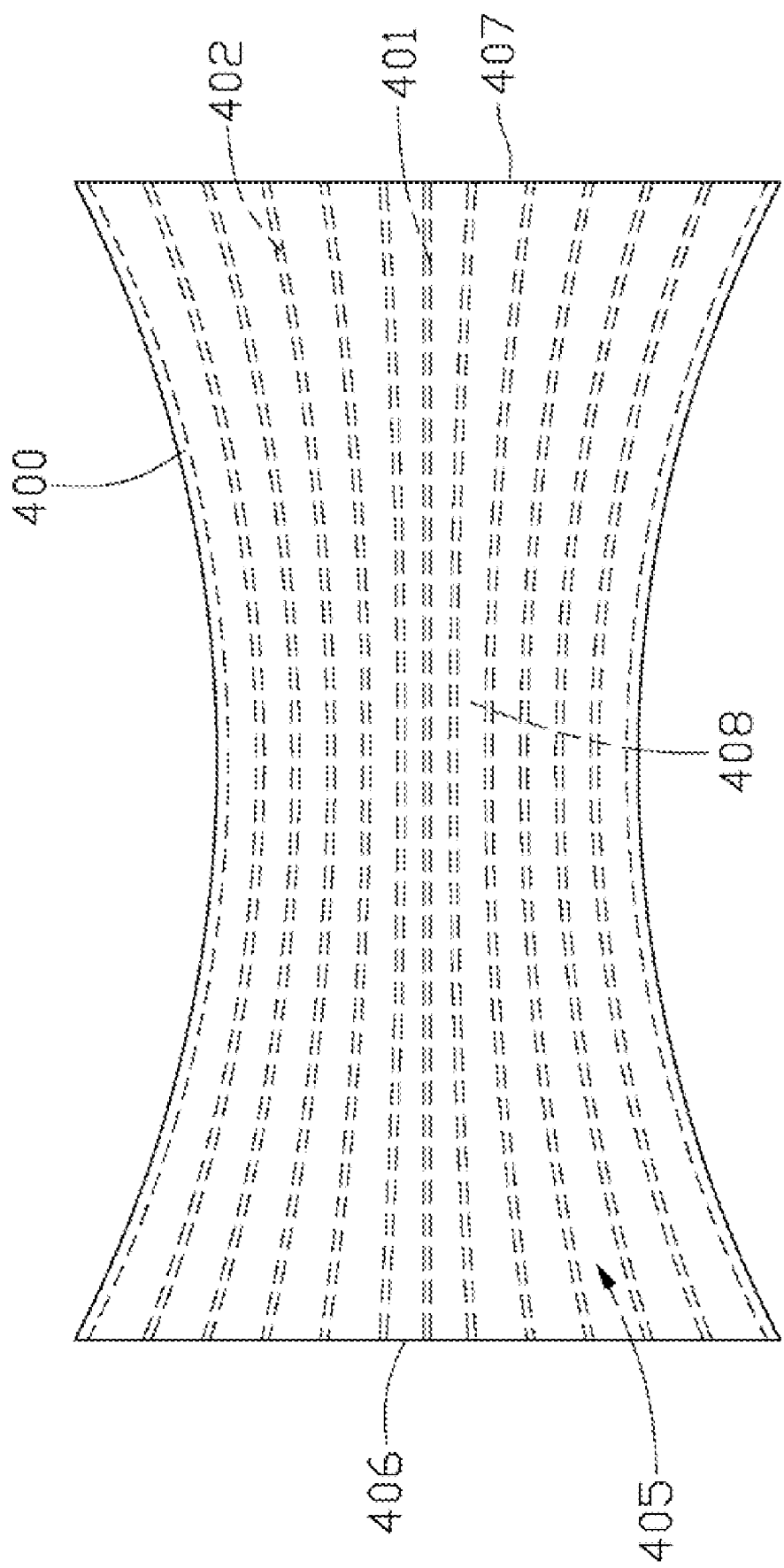
FIG. 3 is a top plan view of a heat sink of the heat dissipation device of FIG. 1.

Referring to FIGS. 1-2, a heat dissipation device according to a preferred embodiment of the present invention includes a substrate 10, a heat pipe 30, a heat spreader 20, a heat sink 40 and a cooling fan 50.

The substrate 10 is formed by an elongated, rectangular and thin plate. Two lengthwise sides of the substrate 10 each have a curved recess (not labeled) at an end thereof for meeting a configuration of the heat sink 40. Top and bottom sides of the substrate 10 are planar-shaped. A groove 12 is defined in the top side of the substrate 10. The heat pipe 30 is received in the groove 12 of the substrate 10. The heat pipe 30 forms an evaporating section 301 and a condensing section 302 at two opposite ends thereof, and an adiabatic section 303 located between the evaporating section 301 and the condensing section 302. The heat spreader 20 is arranged on and thermally attached to the evaporating section 301 of the heat pipe 30. The heat spreader 20 is made of highly thermally conductive material, such as copper, aluminum, or their alloys. A top side of the heat spreader 20 is thermally attached to a heat-generating electronic component 22 such as a CPU of a computer to absorb heat therefrom. The condensing section 302 of the heat pipe 30 is thermally attached to the heat sink 40, whereby the heat pipe 30 can transfer the heat generated by the heat-generating electronic component 22 via the heat spreader 20 to the heat sink 40 for dissipation.

The heat sink 40 includes a shell 400 and a fin assembly received in the shell 400. The shell 400 has top and bottom surfaces being planar shaped and spaced from each other. Each of the top and bottom surfaces has left and right sides being linear-shaped, and front and back sides being concave-shaped. Thus a width of each of the top and bottom surfaces is gradually decreased from the left and right sides to a center 408 thereof. In other words, the width of the top and bottom surfaces is the largest at the left and right sides, and is the smallest at the center 408 thereof. Front and back surfaces interconnect front edges and back edges of the top and bottom surfaces, respectively. Accordingly, the front and back surfaces are arc-shaped. Thus the top, the bottom, the front and the back sides of the shell 400 are closed, and the left and the right sides of the shell 400 are open.

The fin assembly includes a first fin 401 being planar-shaped and a plurality of second fins 402 being arc-shaped. All of the fins 401, 402 extend between the left and right sides of the shell 400. A plurality of flow channels 405 are defined between two adjacent fins 401, 402. The channels 405 communicate with the open sides (the left and right sides) of the shell 400. The first fin 401 is arranged at a middle of the shell 400, and the second fins 402 are arranged at front and back sides of the first fin 401 symmetrically. The second fins 402 arranged on each side of the first fin 401 have a curvature being gradually increased outwardly from the first fin 401 to the front or back surfaces of the shell 400. Thus each channel 405 has a width being gradually increased from the center 408 of the shell 400 to the left and right sides of the shell 400. In other words, the width of each channel 405 decreases from the left and right sides of the shell 400 toward the center 408 of the shell 400. Thus, the channels 405 each have the maximum width at the two open sides (i.e., air inlet 406 and air outlet 407) of the shell 400, and have the minimum width at the center 408 between the two open sides of the shell 400.

When assembled, the heat pipe 30 is received in the groove 12 of the substrate 10 with the evaporating section 301 being arranged at the left side and the condensing section 302 being arranged on the right side of FIG. 2. The heat spreader 20 is arranged on the evaporating section 301 of the heat pipe 30, and the heat-generating electronic component 22 is arranged on the heat spreader 20. The heat sink 40 is arranged on the condensing section 302 of the heat pipe 30 with the channels 405 extending along a direction as the heat pipe 30. The cooling fan 50 is arranged on the substrate 10 between the heat spreader 20 and the heat sink 40 and located corresponding to a position of the adiabatic section 303 of the heat pipe 30. The left open side of the shell 400 forms the air inlet 406, and the right open side of the shell 400 forms the air outlet 407. During operation, the heat-generating electronic component 22 generates heat. Working fluid contained in the evaporating section 301 of the heat pipe 30 absorbs the heat of the heat-generating electronic component 22 via the heat spreader 20 and evaporates into vapor. The vapor moves to the condensing section 302. The vapor is cooled and condensed at the condensing section 302. The condensed working fluid flows back to the evaporating section 301 to begin another thermal cycle. The heat of the heat-generating electronic component 22 is thus almost immediately released to the fin assembly through the heat pipe 30. The airflow generated by the cooling fan 50 flows into the air inlet 406 and then through the channels 405 of the fin assembly to take away the heat of the fins 401, 402. Finally the heated airflow flows through the air outlet 407 to the environment and dissipates the heat to surrounding atmosphere.

In the present invention, as the second fins 402 are arc-shaped, the channels 405 formed between the fins 401, 402 each have a variable width which is larger at the air inlet 406 and the air outlet 407 for the airflow flowing into/out the channels 405 easily, and is smaller at the middle portion between the air inlet 406 and outlet 407. Thus a speed of the airflow increases from the air inlet 406 to the center 408 of the heat sink 40 and then decreases form the center 408 of the heat sink 40 to the air outlet 407. As the speed of the airflow varies at different times, the laminar air envelopes formed at the surfaces of the conventional planar-shaped fins are destroyed by the arc-shaped fins 402 of the present heat sink 40. The degree of heat exchange between the airflow and the fin assembly is thus greatly improved. Therefore, the airflow flowing through the fin assembly can sufficiently assist the heat dissipation from the heat-generating electronic component 22. Accordingly, heat dissipation effectiveness of the heat dissipation device in accordance with the present invention is improved.

Figure 4:
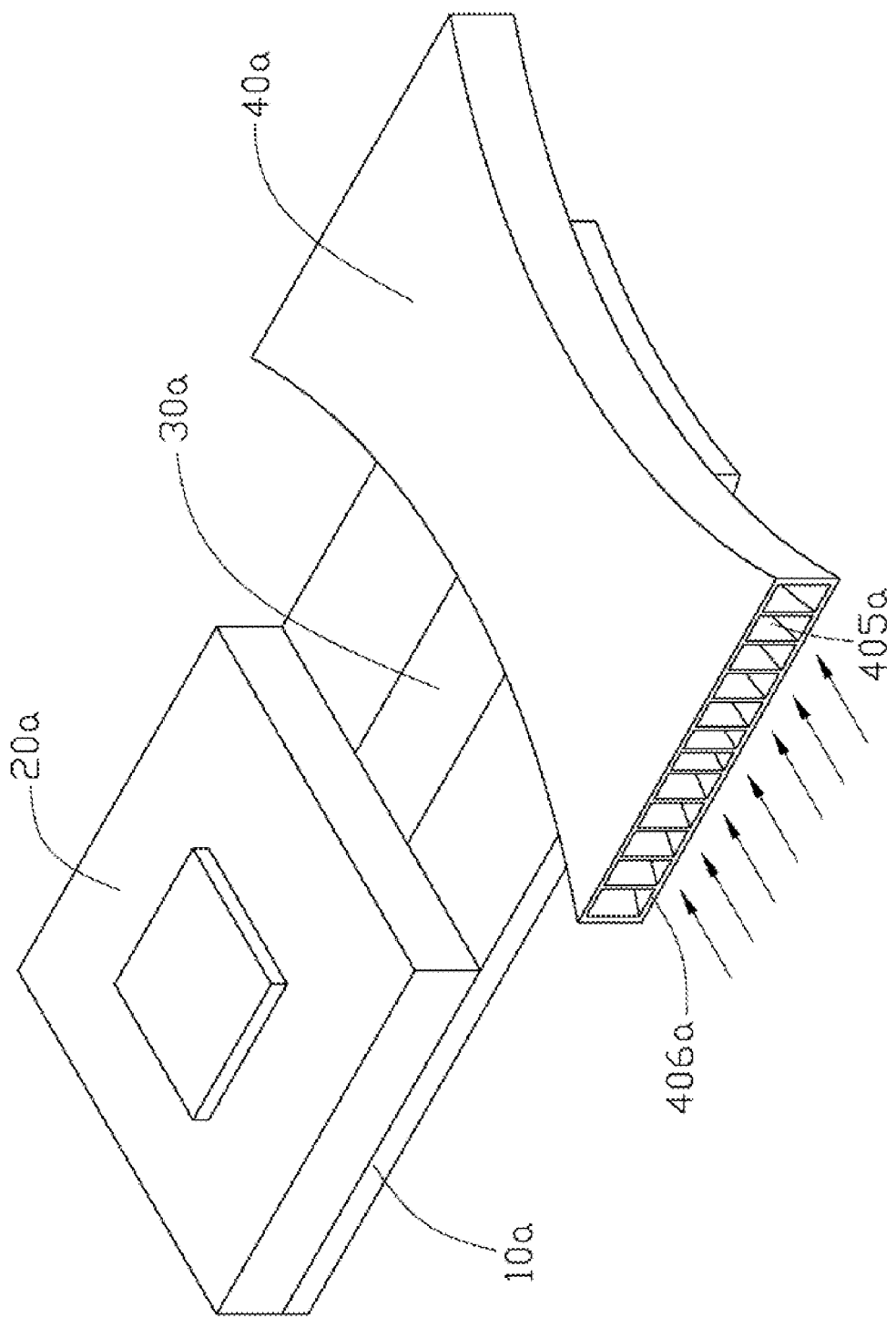
FIG. 4 is an isometric, assembled view of the heat dissipation device in accordance with a second embodiment of the present invention.

FIG. 4 shows a heat dissipation device according to an alternative embodiment of the present invention. Also the heat dissipation device has a substrate 10a, a heat spreader 20a, a heat pipe 30a, a heat sink 40a, and a cooling fan (not shown) arranged on the air inlet 406a of the heat sink 40a. The difference between the second embodiment and the first embodiment is that the heat sink 40a is arranged on the condensing section of the heat pipe 30a with the channels 405a being oriented perpendicular to the heat pipe 30a. Thus the portion of each channel 405a which has the minimum width is arranged on the condensing section of the heat pipe 30a to absorb the heat released by the heat pipe 30a.

Figure 5:
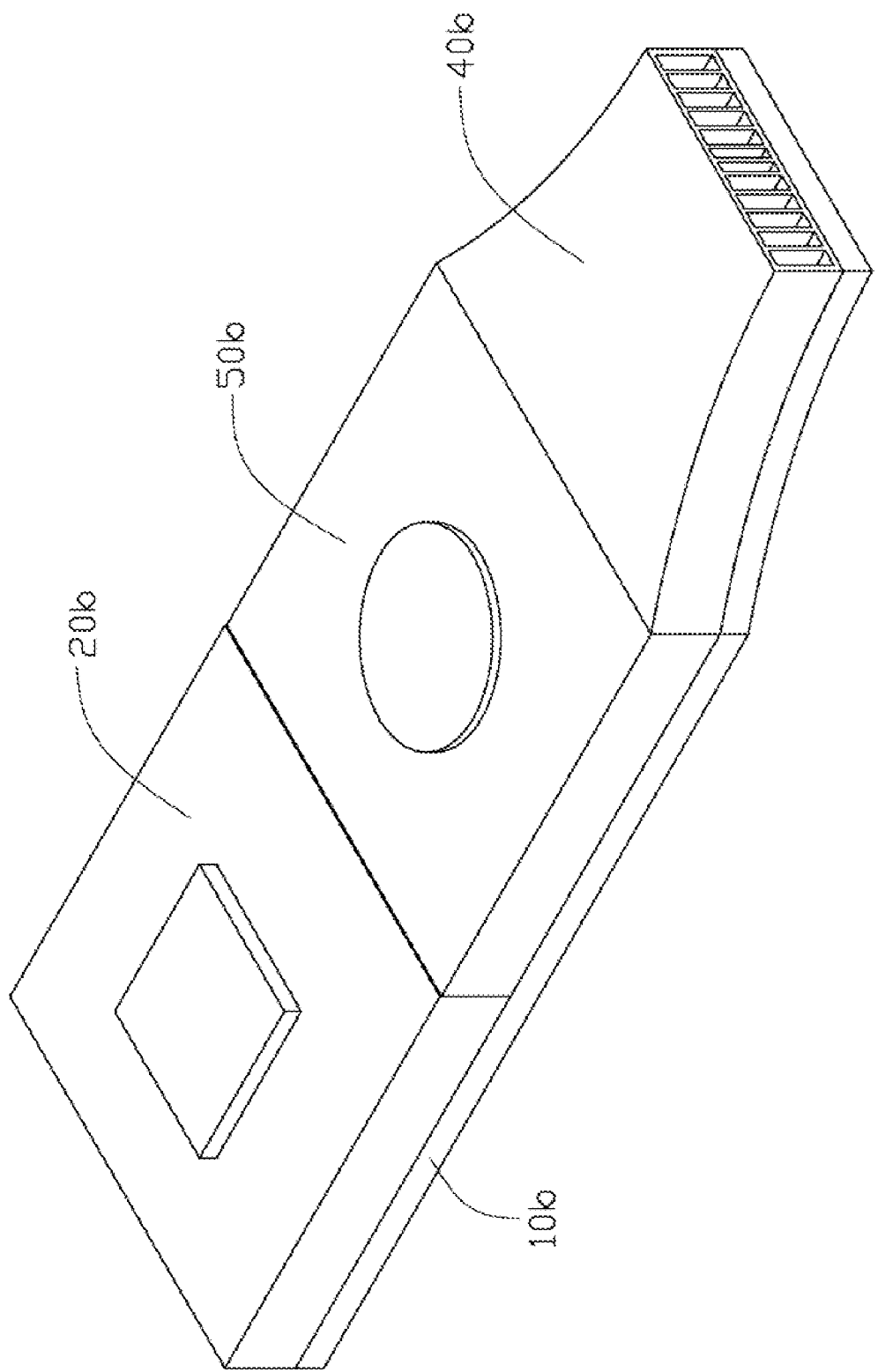
FIG. 5 is similar to FIG. 4, but shows a third embodiment of the heat dissipation device according to the present invention.
Figure 6:
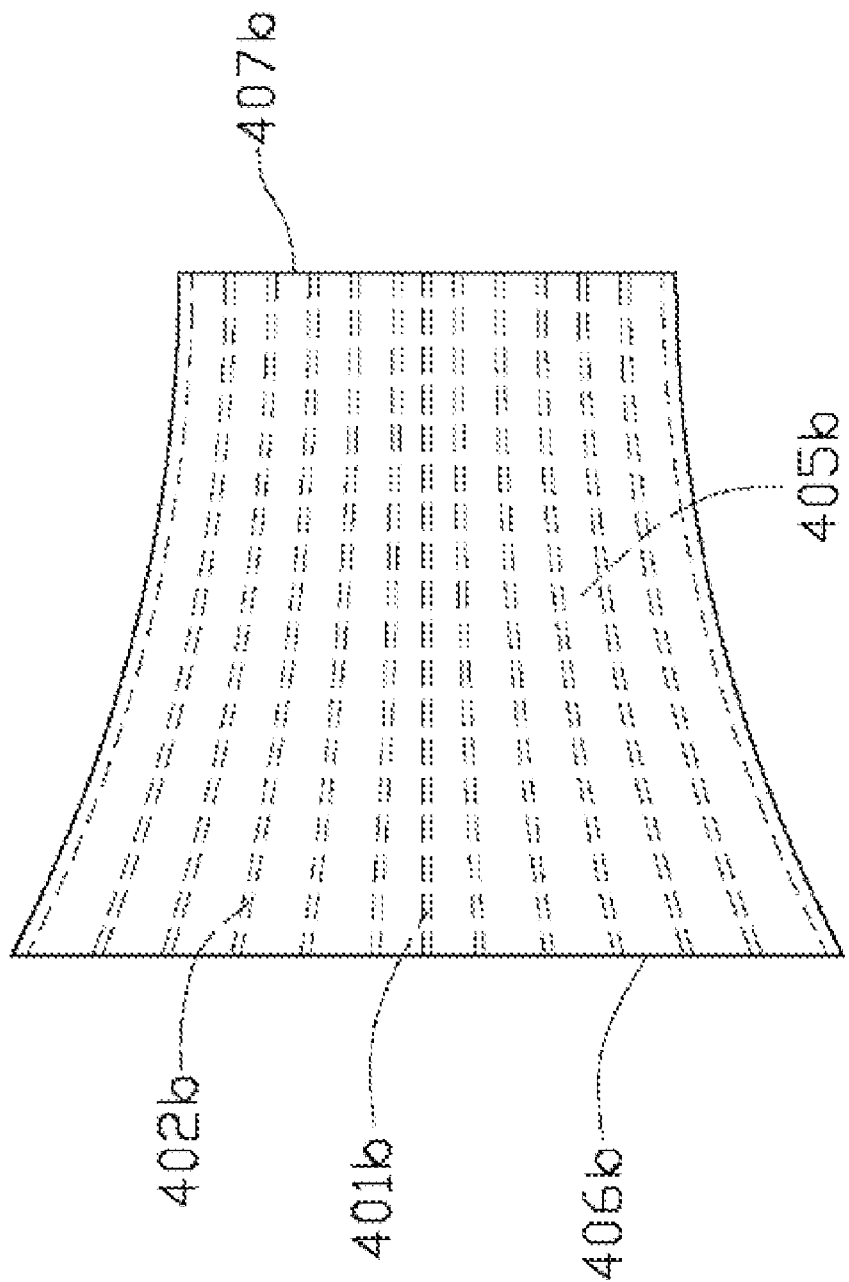
FIG. 6 is a top plan view of the heat sink of FIG. 5.

As shown in FIGS. 5-6, a third embodiment of the heat dissipation device according to the present invention is shown. As the previous embodiment, the heat dissipation device of this embodiment also includes a substrate 10b, a heat pipe 30b received in the substrate 10b, a heat spreader 20b being thermally attached to the evaporating section of the heat pipe, a heat-generating electronic component being arranged on the heat spreader 20b, a heat sink 40b arranged on the condensing section of the heat pipe, and a cooling fan 50b arranged between the heat sink 40b and the heat spreader 20b for generating forced airflow to the heat sink 40b. Also the heat sink 40b has a plurality of fins 401b, 402b defining a plurality of channels 405b therebetween. The difference between the third embodiment and the first embodiment is that the heat sink 40b has a width being gradually decreased from the air inlet 406b (the left open side) to the air outlet 407b (the right open side). Thus the channels 405b each have the maximum width at the air inlet 406b and the minimum width at the air outlet 407b.

Figure 7:
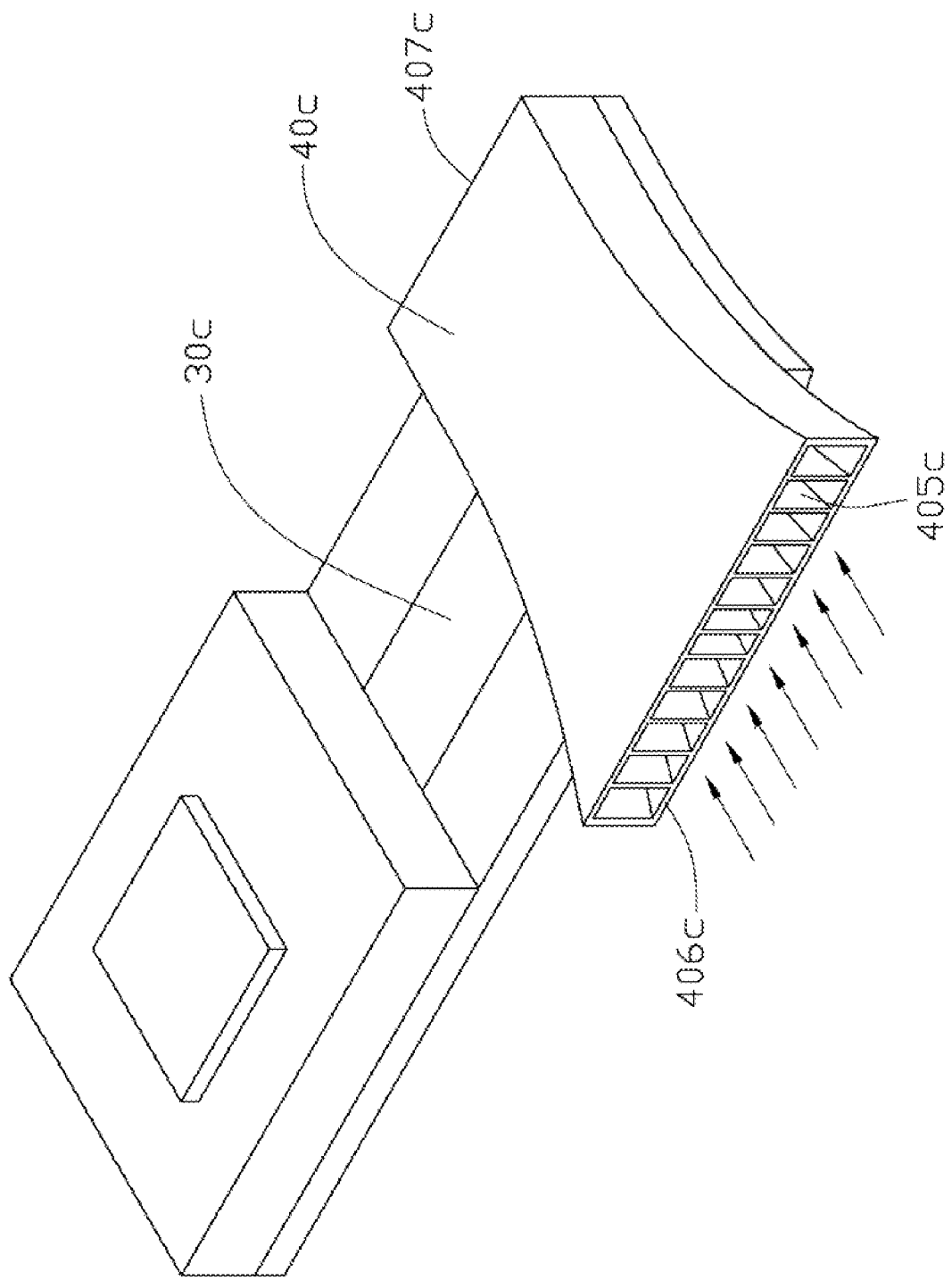
FIG. 7 shows a fourth embodiment of the heat dissipation device according to the present invention.

FIG. 7 also shows the heat sink 40c has a width being gradually decreased from the air inlet 406c to the air outlet 407c, and thus the channels 405c each have the maximum width at the air inlet 406c and the minimum width at the air outlet 407c. The difference between this embodiment and the third embodiment is that the heat sink 40c is arranged perpendicular to the heat pipe 30c, and the channels 405c are accordingly oriented perpendicular to the heat pipe 30c.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
   a heat spreader for thermally attaching to a heat-generating electronic component to absorb heat therefrom;
   a heat pipe having an evaporating section being thermally attached to the heat spreader and a condensing section extending from the evaporating section to a position beyond the heat spreader and thermally connected to a heat sink;
   a cooling fan for generating forced airflow; and
   the heat sink having a fin assembly defining a plurality of channels for the airflow flowing therethrough, each of the channels having an air inlet from which the forced airflow enters the heat sink and an air outlet for the forced airflow flowing out the heat sink, along a flowing direction of the airflow a width of the each of the channels between two adjacent fins gradually decreased along an entire length of the each of the channels, the each of the channels having a maximum width at the air inlet and a minimum width at the air outlet.

2. The heat dissipation device of claim 1, wherein the heat sink further comprises a shell receiving the fin assembly therein, the shell defining two opposite open sides for the airflow flowing in/out the heat sink, along the flowing direction of the airflow, the shell having a width gradually decreased along its entire length, and thus the shell having a minimum width at one side thereof corresponding to the air outlet and a maximum width at an opposite side thereof corresponding to the air inlet.

3. The heat dissipation device of claim 1, wherein the channels are perpendicular to the heat pipe.

4. The heat dissipation device of claim 1 further comprising a substrate, the heat spreader and the heat sink being arranged on two opposite sides of the substrate.

5. The heat dissipation device of claim 4, wherein the substrate defines a groove receiving the heat pipe therein.

6. The heat dissipation device of claim 1, wherein the fin assembly includes a planar-shaped first fin and a plurality of arc-shaped second fins arranged symmetrically at two opposite sides of the first fin.

7. The heat dissipation device of claim 6, wherein the second fins arranged on each side of the first fin each have a curvature being gradually increased outwardly from the first fin.

8. A heat dissipation device comprising:
a heat-generating electronic component;
a heat spreader thermally connecting with the heat-generating electronic component to absorb heat therefrom;
a heat pipe having an evaporating section thermally connecting with the heat spreader and a condensing section;
a heat sink thermally connecting with the condensing section of the heat pipe and having a plurality of fins defining a plurality of channels therebetween, wherein a width of each of the channels is varied along a length thereof;
wherein the channels each have a maximum width at a first opened end thereof and a minimum width at a second opened end thereof, the second opened end being opposite to the first opened end, a fan being located between the first opened end of the each channel of the heat sink and the heat spreader.

9. The heat dissipation device of claim 8, wherein the fins are arc-shaped.

10. The heat dissipation device of claim 4, wherein the cooling fan is arranged on the substrate between the heat spreader and the heat sink and located corresponding to a position of an adiabatic section of the heat pipe.

11. The heat dissipation device of claim 5, wherein the cooling fan is arranged on the substrate between the heat spreader and the heat sink and located corresponding to a position of an adiabatic section of the heat pipe.

12. The heat dissipation device of claim 1, wherein the channels are parallel to the heat pipe.

13. A heat dissipation device comprising:
a heat-generating electronic component;
an elongated flat substrate defining an elongated groove therein;
a straight heat pipe being received in the groove of the substrate entirely, the heat pipe having an evaporating section and a condensing section formed at two opposite ends, and an adiabatic section between the evaporating section and the condensing section;
a heat spreader thermally connecting with the heat-generating electronic component to absorb heat therefrom, the heat spreader being arranged on the substrate and thermally attaching to the evaporating section of the heat pipe;
a cooling fan for generating a forced airflow; and
a heat sink arranged on the substrate and thermally attaching to the condensing section of the heat pipe, the heat sink comprising a plurality of fins defining a plurality of channels therebetween, each of the channels having an air inlet from which the forced airflow enters the heat sink and an air outlet for the forced airflow flowing out the heat sink, each channel having a width between two adjacent fins gradually decreasing from the air inlet to a middle of the each channel.

14. The heat dissipation device of claim 13, wherein the width of each channel between two adjacent fins gradually decreases from the air inlet along an entire length of the each channel to the air outlet.

15. The heat dissipation device of claim 14, wherein the fan is arranged on the substrate between the heat spreader and the heat sink and located corresponding to the adiabatic section of the heat pipe.

16. The heat dissipation device of claim 14, wherein the channels are perpendicular to heat pipe.

17. The heat dissipation device of claim 13, wherein the width of each channel between two adjacent fins gradually increases from the middle of the each channel to the air outlet.

18. The heat dissipation device of claim 17, wherein the fan is arranged on the substrate between the heat spreader and the heat sink, and located corresponding to the adiabatic section of the heat pipe.

19. The heat dissipation device of claim 17, wherein the channels are perpendicular to heat pipe.

* * * * *